(12) United States Patent
Yagishita

(10) Patent No.: US 11,205,997 B2
(45) Date of Patent: Dec. 21, 2021

(54) POWER AMPLIFICATION APPARATUS AND ELECTROMAGNETIC RADIATION APPARATUS

(71) Applicant: FUJITSU LIMITED, Kawasaki (JP)

(72) Inventor: Yohei Yagishita, Isehara (JP)

(73) Assignee: FUJITSU LIMITED, Kawasaki (JP)

( * ) Notice: Subject to any disclaimer, the term of this patent is extended or adjusted under 35 U.S.C. 154(b) by 97 days.

(21) Appl. No.: 16/797,545

(22) Filed: Feb. 21, 2020

(65) Prior Publication Data

US 2020/0304075 A1  Sep. 24, 2020

(30) Foreign Application Priority Data

Mar. 20, 2019 (JP) .............................. JP2019-053358

(51) Int. Cl.
| | |
|---|---|
| *H03F 3/191* | (2006.01) |
| *H03F 1/08* | (2006.01) |
| *H03F 3/193* | (2006.01) |
| *H03F 3/21* | (2006.01) |
| *H03F 1/56* | (2006.01) |

(52) U.S. Cl.
CPC ................. *H03F 1/08* (2013.01); *H03F 1/56* (2013.01); *H03F 3/193* (2013.01); *H03F 3/21* (2013.01); *H03F 2200/387* (2013.01)

(58) Field of Classification Search
CPC . H03F 1/56; H03F 3/191; H03F 3/193; H03F 2200/387

USPC .......................................... 330/302, 306, 307
See application file for complete search history.

(56) References Cited

U.S. PATENT DOCUMENTS 5,717,249 A   2/1998 Yoshikawa et al.

FOREIGN PATENT DOCUMENTS

| JP | H08-335836 A | 12/1996 | |
|---|---|---|---|
| JP | 2003-309198 A | 10/2003 | |
| JP | 2015-103913 A | 6/2015 | |
| WO | WO-03081670 A1 * | 10/2003 | ......... H01L 23/5222 |

\* cited by examiner

*Primary Examiner* — Steven J Mottola
(74) *Attorney, Agent, or Firm* — Fujitsu Patent Center

(57) ABSTRACT

An apparatus includes: a transistor including an input terminal for an input signal and an output terminal for an output signal; a matching circuit configured to match a load impedance regarding a fundamental harmonic of at least one of the input signal and the output signal to an impedance of the transistor and include a first conductive film being laminated over the transistor and coupled to at least one of the input terminal and the output terminal; and a processing circuit configured to adjust an impedance regarding a harmonic of at least one of the input signal and the output signal and include a second conductive film being laminated over the first conductive film and coupled to at least one of the input terminal and the output terminal through a via which penetrates through a dielectric layer sandwiched between the first conductive film and the second conductive film.

4 Claims, 17 Drawing Sheets

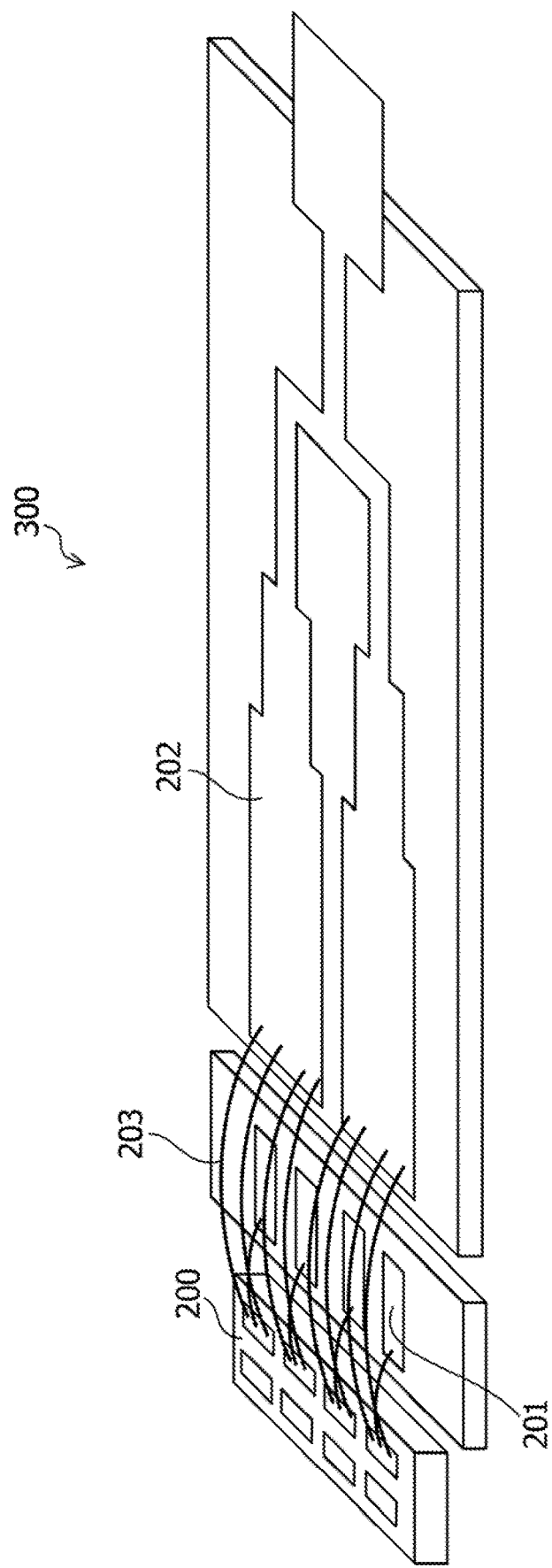

POWER AMPLIFICATION APPARATUS AND ELECTROMAGNETIC RADIATION APPARATUS

CROSS-REFERENCE TO RELATED APPLICATION

This application is based upon and claims the benefit of priority of the prior Japanese Patent Application No. 2019-53358, filed on Mar. 20, 2019, the entire contents of which are incorporated herein by reference.

FIELD

The embodiments discussed herein are related to a power amplification apparatus including a harmonic processing circuit, and an electromagnetic radiation apparatus.

BACKGROUND

The following technology has been proposed as a technology related to a harmonic processing circuit. For example, a semiconductor apparatus has been proposed in which an input side matching circuit substrate including the harmonic processing circuit and an output side matching circuit substrate are electrically coupled to a semiconductor device. In this semiconductor apparatus, the input side matching circuit substrate and the output side matching circuit substrate are constituted by a high dielectric substrate and a low dielectric substrate that have different dielectrics, where fundamental harmonic matching process is performed in a layer having a high dielectric, and harmonic process for a second harmonic and a third harmonic is performed in a layer having a low dielectric.

A high frequency amplifier has been proposed which is constituted in a manner that a wiring coupled to a source electrode of a transistor is formed over an insulation layer film existing between the transistor and a matching circuit among a plurality of insulation layer films, and the wiring covers upper parts of a gate electrode and a drain electrode of the transistor.

A high frequency power amplification circuit apparatus constituted by laminating a plurality of ceramic substrates has been described. In this apparatus, a semiconductor chip and a high frequency matching circuit are mounted over an uppermost first ceramic substrate, a ground layer is formed over an intermediate second ceramic substrate, and a bias circuit and a ground electrode are respectively formed over an upper surface and a lower surface of a lowermost third ceramic substrate.

Examples of the related art include Japanese Laid-open Patent Publication Nos. 2003-309198, 2015-103913, and 8-335836.

SUMMARY

According to an aspect of the embodiments, a power amplification apparatus includes: a transistor including an input terminal to which an input signal is input and an output terminal from which an output signal is output; a fundamental harmonic matching circuit configured to include a first conductive film and match a load impedance with respect to a fundamental harmonic of at least one of the input signal and the output signal to an impedance of the transistor, the first conductive film being laminated over the transistor and coupled to at least one of the input terminal and the output terminal; and a harmonic processing circuit configured to include a second conductive film and adjust an impedance with respect to a harmonic of at least one of the input signal and the output signal, the second conductive film being laminated over the first conductive film and coupled to at least one of the input terminal and the output terminal through a via which penetrates through a dielectric layer, the dielectric layer being sandwiched between the first conductive film and the second conductive film.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 4 is a perspective view illustrating an example of a configuration of the power amplification apparatus;

DESCRIPTION OF EMBODIMENTS

In a power amplification apparatus that amplifies and outputs power of a high frequency input signal, impedance matching is mainly performed with respect to a fundamental harmonic among a plurality of frequency components to improve a power conversion efficiency.

Figure 1:
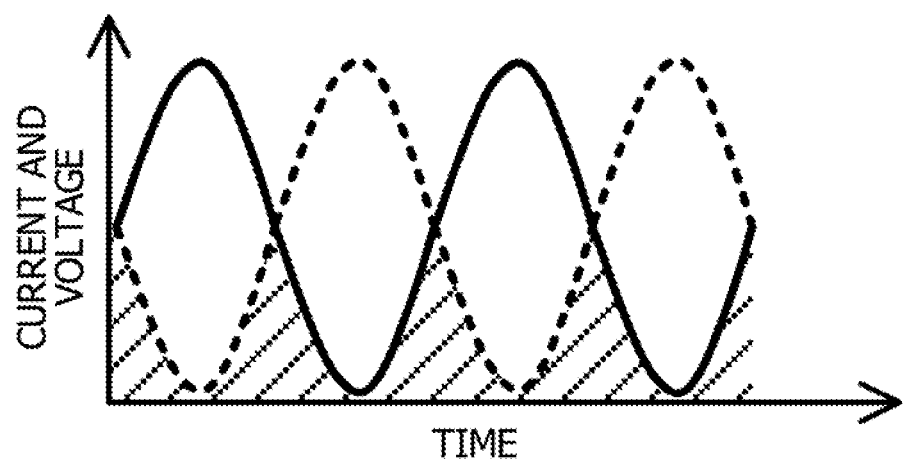
FIG. 1 illustrates an example of current and voltage waveforms when a power amplification apparatus is operated in class A operation.

FIG. 1 is a drawing illustrating an example of current and voltage waveforms when a power amplification apparatus is operated in class A operation. In the class A operation, the current waveform and the voltage waveform have mutually inverted relationships, and power is converted into heat and consumed in a region where both a current and a voltage are generated which is indicated by hatching in FIG. 1. A conversion efficiency (power added efficiency: PAE) represented by the following Expression (1) in the class A operation is approximately 60%. For example, when the conversion efficiency PAE of the power amplification apparatus of 300 W class is 60%, 120 W is converted into heat, and there is a possibility that heat dissipation is not in time, and device performances constituting the power amplification apparatus are degraded or damaged. In Expression (1), $P_{out}$ denotes output power output from the power amplification apparatus, $P_{in}$ denotes input power input to the power amplification apparatus, and $P_{dc}$ denotes direct current power supplied to the power amplification apparatus.

$$PAE = \frac{P_{out} - P_{in}}{P_{dc}} \quad (1)$$

Figure 2:
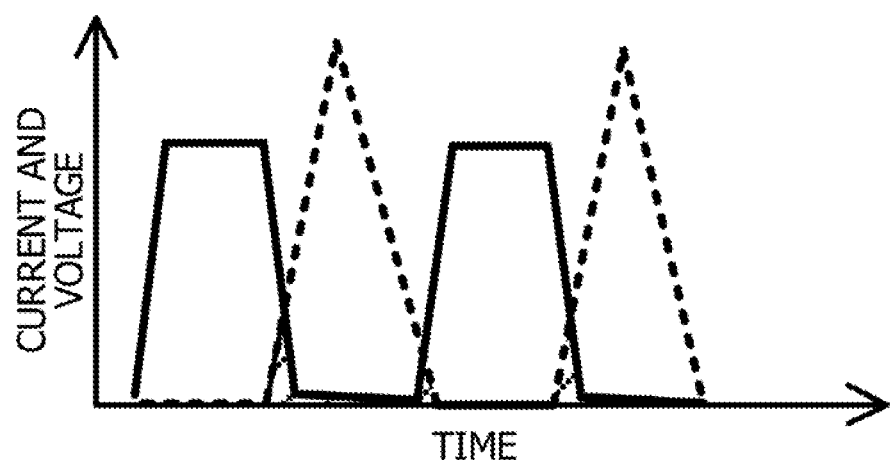
FIG. 2 illustrates an example of the current and voltage waveforms when the power amplification apparatus is operated in class F operation.

FIG. 2 is a drawing illustrating an example of the current and voltage waveforms when the power amplification apparatus is operated in class F operation. In the class F operation, the voltage waveform becomes a rectangular wave, and the current waveform becomes a half-wave rectification waveform. The current during a period in which the voltage is generated becomes approximately zero, and the voltage during a period in which the current is generated becomes approximately zero. Therefore, the area of the region where both the current and the voltage are generated which is indicated by hatching in FIG. 2 is substantially decreased as compared with the case of the class A operation. That is, for example, when the power amplification apparatus is operated in the class F operation, the conversion efficiency PAE may be largely improved as compared with a case where the power amplification apparatus is operated in the class A operation.

A current $I_d$ when the power amplification apparatus is operated in the class F operation is represented by Expression (2), and a voltage $V_d$ is represented by Expression (3). In Expression (2), $I_{max}$ denotes a peak value of the current $I_d$, and in Expression (3), $V_{max}$ denotes a peak value of the voltage $V_d$.

$$I_d = \frac{I_{max}}{\pi}\left(1 + \frac{\pi}{2}\cos\omega t + \frac{2}{3}\cos 2\omega t - \frac{2}{15}\cos 4\omega t ...\right) \quad (2)$$

$$V_d = V_{max}\left(\frac{1}{2} - \frac{2}{\pi}\cos\omega t + \frac{2}{3\pi}\cos 3\omega t - \frac{2}{5\pi}\cos 5\omega t ...\right) \quad (3)$$

Figure 3:
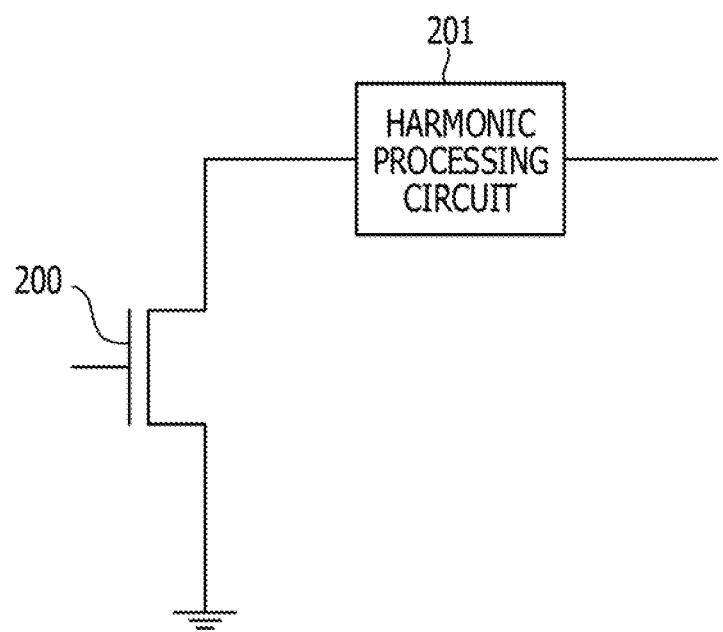
FIG. 3 illustrates an example of a configuration for realizing the class F operation.

As illustrated in Expression (2), the current $I_d$ is superposition of even-numbered order harmonics, and the voltage $V_d$ is superposition of odd-numbered order harmonics. To realize the class F operation in the power amplification apparatus, it is sufficient when an impedance with respect to the odd-numbered order harmonics (mainly, the third harmonic) is set as infinite, and an impedance with respect to the even-numbered order harmonics (mainly, the second harmonic) is set as zero. The aforementioned impedance adjustment to the harmonics is realized by coupling a harmonic processing circuit 201 that adjusts an impedance of a harmonic to an output terminal (drain) of a transistor 200 for power amplification as illustrated in FIG. 3, for example. It is desirable that the impedance with respect to both the second harmonic and the third harmonic is adjusted to an appropriate impedance, but even when the impedance adjustment is performed with respect to only the second harmonic, the conversion efficiency PAE is improved by approximately 10%.

FIG. 4 is a perspective view illustrating an example of a configuration of a power amplification apparatus 300 including the harmonic processing circuit 201 that adjusts the impedance with respect to the harmonic (for example, the second harmonic). The power amplification apparatus 300 includes a fundamental harmonic matching circuit 202 that matches a load impedance with respect to the fundamental harmonic of a signal output from the transistor 200 to the impedance of the transistor in addition to the transistor 200 for power amplification and the harmonic processing circuit 201. The transistor 200, the harmonic processing circuit 201, and the fundamental harmonic matching circuit 202 are juxtaposed over a same plane, and the harmonic processing circuit 201 is arranged between the transistor 200 and the fundamental harmonic matching circuit 202. The transistor 200 and the harmonic processing circuit 201, and the transistor 200 and the fundamental harmonic matching circuit 202 are respectively coupled to each other by wires 203.

However, in accordance with this configuration, a length of the wire 203 that couples the transistor 200 to the fundamental harmonic matching circuit 202 is lengthened. Since an output impedance of the transistor 200 is normally low at approximately a several ohms, when the length of the wire 203 is lengthened, loss components of the wire 203 look large. That is, for example, in accordance with the configuration illustrated in FIG. 4, even when the conversion efficiency is improved by the harmonic processing circuit 201, the loss in the fundamental harmonic matching circuit 202 becomes excessive, and it becomes difficult to improve the conversion efficiency as the entire power amplification apparatus 300.

As one aspect, a disclosed technology is aimed at increasing the conversion efficiency of the power amplification apparatus as compared with a related art.

As one aspect, according to the disclosed technology, it becomes possible to increase the conversion efficiency of the power amplification apparatus as compared with the related art.

Hereinafter, an example of an embodiment of the present disclosure is described with reference to the drawings. Same or equivalent components and parts in the respective drawings are assigned with same reference signs, and duplicated descriptions are appropriately omitted.

Figure 5A:
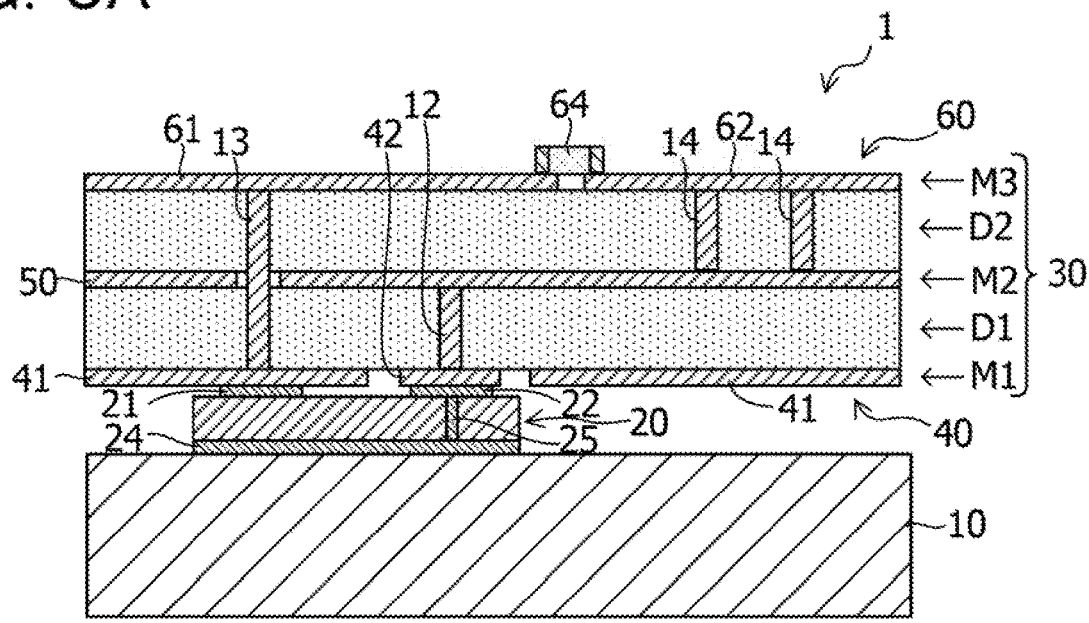
FIG. 5A is a cross sectional view illustrating an example of the configuration of the power amplification apparatus according to an embodiment of a disclosed technology.
Figure 5B:
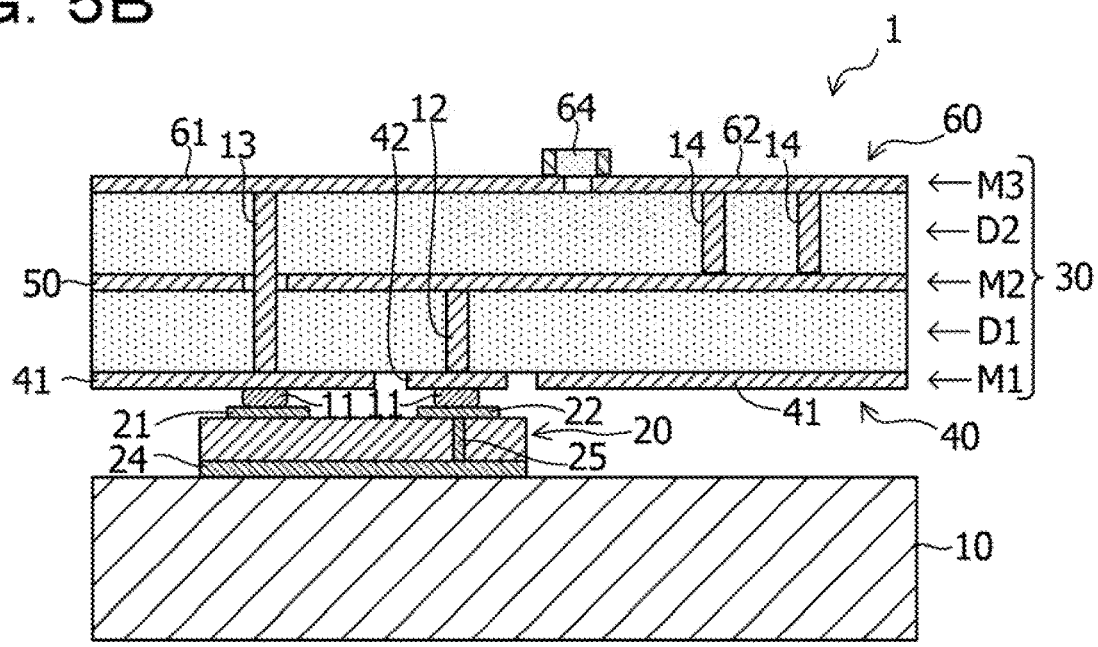
FIG. 5B is a cross sectional view illustrating an example of the configuration of the power amplification apparatus according to the embodiment of the disclosed technology.

FIG. 5A and FIG. 5B are cross sectional views respectively illustrating examples of a configuration of a power amplification apparatus 1 according to the embodiment of the disclosed technology. The power amplification apparatus 1 is constituted by including a base member 10, a transistor 20, and a multilayer substrate 30.

The base member 10 is composed of a material having relatively high conductivity and thermal conductivity such as aluminum or copper and has the transistor 20 mounted to a front surface. The base member 10 is applied with a ground potential.

The transistor 20 is an active device for power amplification and includes a gate electrode serving as an input terminal to which an input signal is input (not illustrated in FIG. 5A and FIG. 5B), a drain electrode 21 serving as an output terminal from which an output signal is output, and a source electrode 22 serving as a ground terminal to which the ground potential is applied to an upper surface side. A rear surface electrode 24 coupled to the source electrode 22 through a via 25 is disposed over a lower surface of the transistor 20. The rear surface electrode 24 is bonded to the base member 10 using a conductive bonding member such as AuSn and Ag paste. That is, for example, the ground potential is applied to the source electrode 22 of the transistor 20 via the base member 10, the rear surface electrode 24, and the via 25. For example, a gallium nitride high-electron-mobility transistor (GaN-HEMT) proposed as a high frequency and high output transistor may be used as the transistor 20. A high frequency signal in which a frequency of a fundamental harmonic is 2.45 GHz is assumed as the input signal input to the gate electrode of the transistor 20 and the output signal output from the drain electrode 21 of the transistor 20 in one example.

The multilayer substrate 30 is laminated over the transistor 20. The multilayer substrate 30 has a laminate structure in which a first metal layer M1, a first dielectric layer D1, a second metal layer M2, a second dielectric layer D2, and a third metal layer M3 are laminated in the stated order. A conductive film disposed over the first metal layer M1 is coupled to any one of the drain electrode 21, the source electrode 22, and the gate electrode of the transistor 20.

The laminate structure of the multilayer substrate 30 and the transistor 20 may be realized using a fan out wafer level package (FOWLP) technology, for example. According to the FOWLP technology, the respective metal layers constituting the multilayer substrate 30 are formed using rewiring process, and as illustrated in FIG. 5A, the transistor 20 may be coupled to the multilayer substrate 30 without using a wire and a bump. The laminate structure of the multilayer substrate 30 and the transistor 20 may also be realized using a flip chip bonding technology. According to the flip chip bonding technology, the multilayer substrate 30 and the transistor 20 that are separately fabricated are coupled to each other via bumps 11 as illustrated in FIG. 5B.

Figure 6:
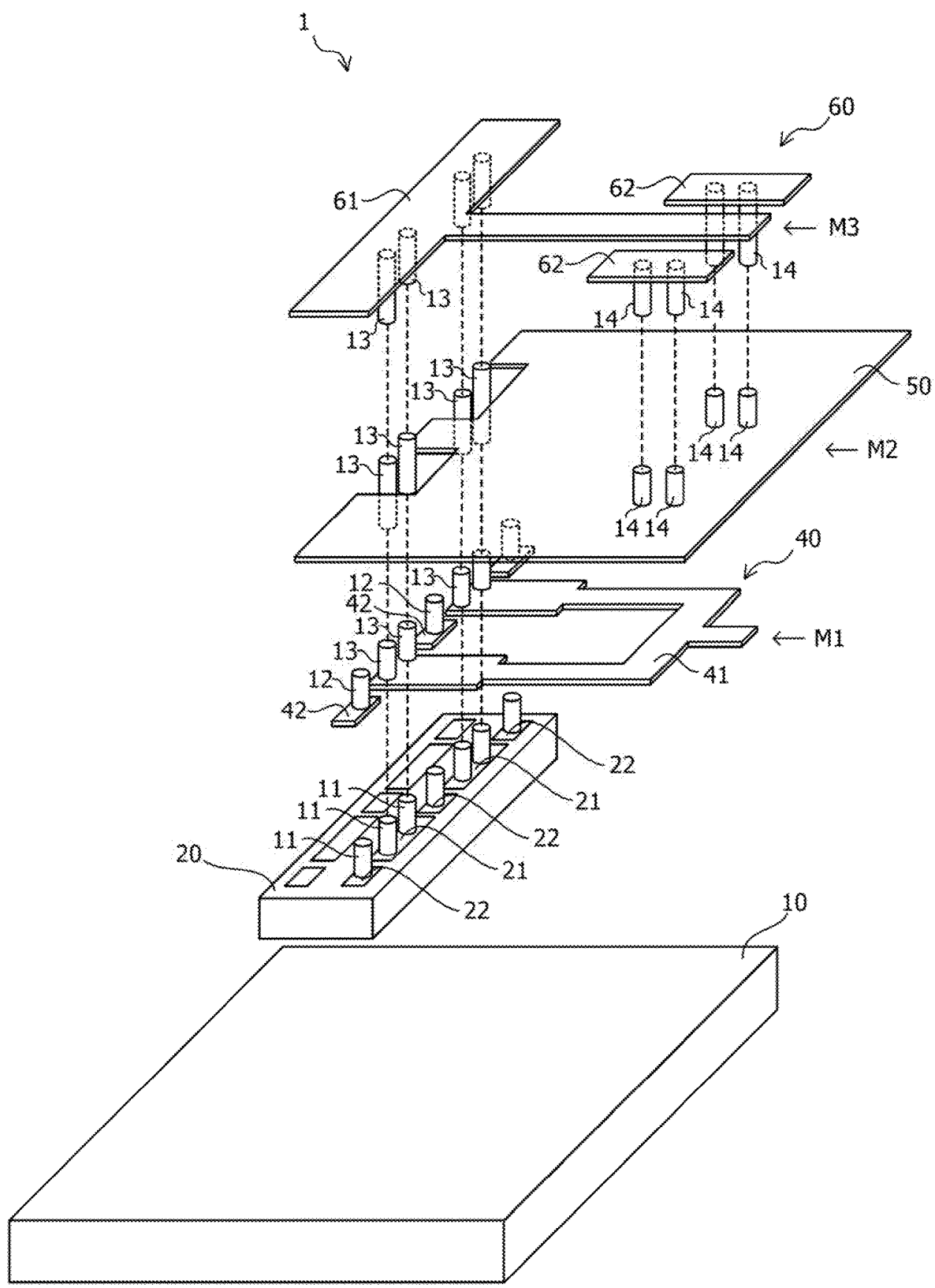
FIG. 6 is a perspective exploded view illustrating components of the power amplification apparatus according to the embodiment of the disclosed technology.

FIG. 6 is a perspective exploded view illustrating components of the power amplification apparatus 1. In FIG. 6, the first dielectric layer D1 and the second dielectric layer D2 are omitted.

A conductive film 41 constituting a fundamental harmonic matching circuit 40 is disposed over the first metal layer M1 laminated over the transistor 20. The fundamental harmonic matching circuit 40 is a circuit that matches a load impedance with respect to a fundamental harmonic of the output signal output from the drain electrode 21 of the transistor 20 to an impedance of the transistor 20. The load impedance is an input impedance of a load (not illustrated) that receives power supply from the transistor 20. When the coupling between the multilayer substrate 30 and the transistor 20 is performed using the flip chip bonding technology, the conductive film 41 constituting the fundamental harmonic matching circuit 40 is coupled to the drain electrode 21 via the bump 11. A conductive film 42 coupled to the source electrode 22 via the bump 11 is disposed over the first metal layer M1. The conductive film 42 is insulated from the conductive film 41.

Figure 7:
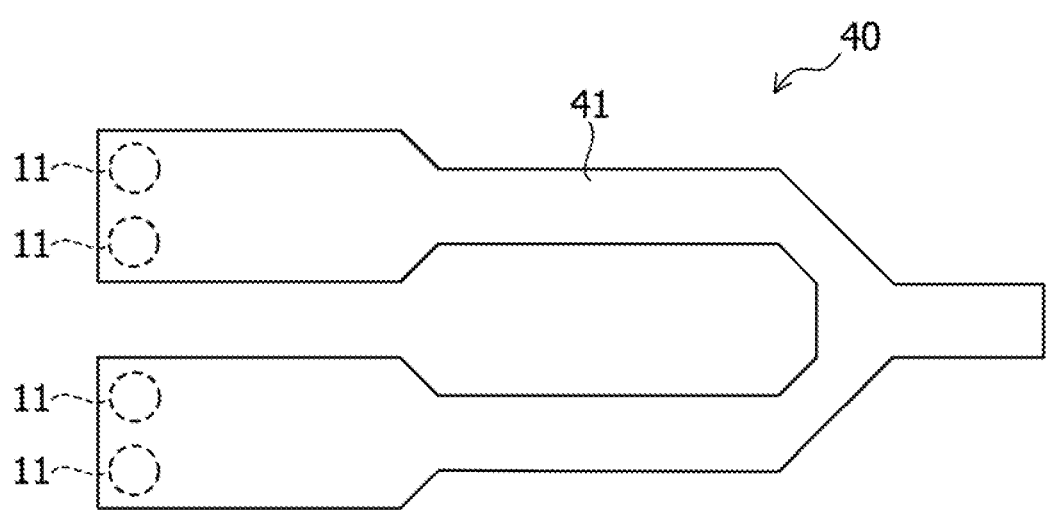
FIG. 7 is a plan view illustrating an example of a pattern of a conductive film constituting a fundamental harmonic matching circuit according to the embodiment of the disclosed technology.

FIG. 7 is a plan view illustrating an example of a pattern of the conductive film 41 constituting the fundamental harmonic matching circuit 40. The conductive film 41 is coupled to the bump 11 at one end portion and extends towards the other end portion. The impedance of the fundamental harmonic matching circuit 40 may be adjusted by adjusting shapes or dimensions of respective parts of the conductive film 41 and the load impedance with respect to the fundamental harmonic of the output signal may be matched to the impedance of the transistor 20.

The first dielectric layer D1 is laminated over the first metal layer M1. For example, the first dielectric layer D1 is constituted by a dielectric such as alumina and zirconium.

The second metal layer M2 is laminated over the first dielectric layer D1. The first the second metal layer M2 includes a conductive film 50 coupled to the source electrode 22 through a via 12 that penetrates through the first dielectric layer D1 and the conductive film 42 disposed over the first metal layer M1. That is, for example, the conductive film 50 is electrically coupled to the source electrode 22, and the ground potential is applied to the conductive film 50.

Figure 8:
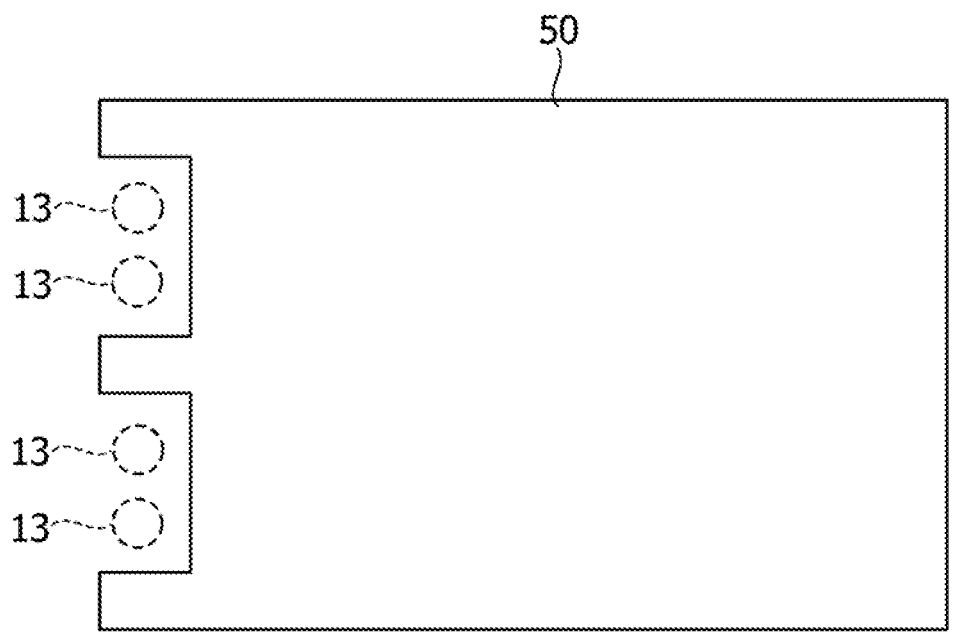
FIG. 8 is a plan view illustrating an example of a pattern of a conductive film disposed over a second metal layer according to the embodiment of the disclosed technology.

FIG. 8 is a plan view illustrating an example of a pattern of the conductive film 50 disposed over the second metal layer M2 according to the embodiment of the disclosed technology. The conductive film 50 extends across substantially an entire area of the second metal layer M2, and accordingly a ground plane is formed over the second metal layer M2. Patterning is performed over the conductive film 50 so as to avoid a via 13 that extends up to the third metal layer M3 while passing through the second metal layer M2 from the first metal layer M1.

The third metal layer M3 is laminated over the second dielectric layer D2. Conductive films 61 and 62 that constitute a harmonic processing circuit 60 are disposed over the third metal layer M3. The harmonic processing circuit 60 is a circuit that adjusts an impedance of the harmonic of the output signal output from the drain electrode 21 of the transistor 20. According to the present embodiment, the harmonic processing circuit 60 adjusts the impedance with respect to the second harmonic of the output signal to zero. The class F operation may be realized in the power amplification apparatus 1 by adjusting the impedance with respect to the second harmonic of the output signal to zero. The conductive film 61 that constitutes the harmonic processing circuit 60 is coupled to the drain electrode 21 through the via 13 that penetrates through the first dielectric layer D1 and the second dielectric layer D2 and the conductive film 41 disposed over the first metal layer M1. The conductive film 62 that constitutes the harmonic processing circuit 60 is coupled to the conductive film 50 disposed over the second metal layer M2 through a via 14 that penetrates through the second dielectric layer D2. That is, for example, the ground potential is applied to the conductive film 62.

Figure 9:
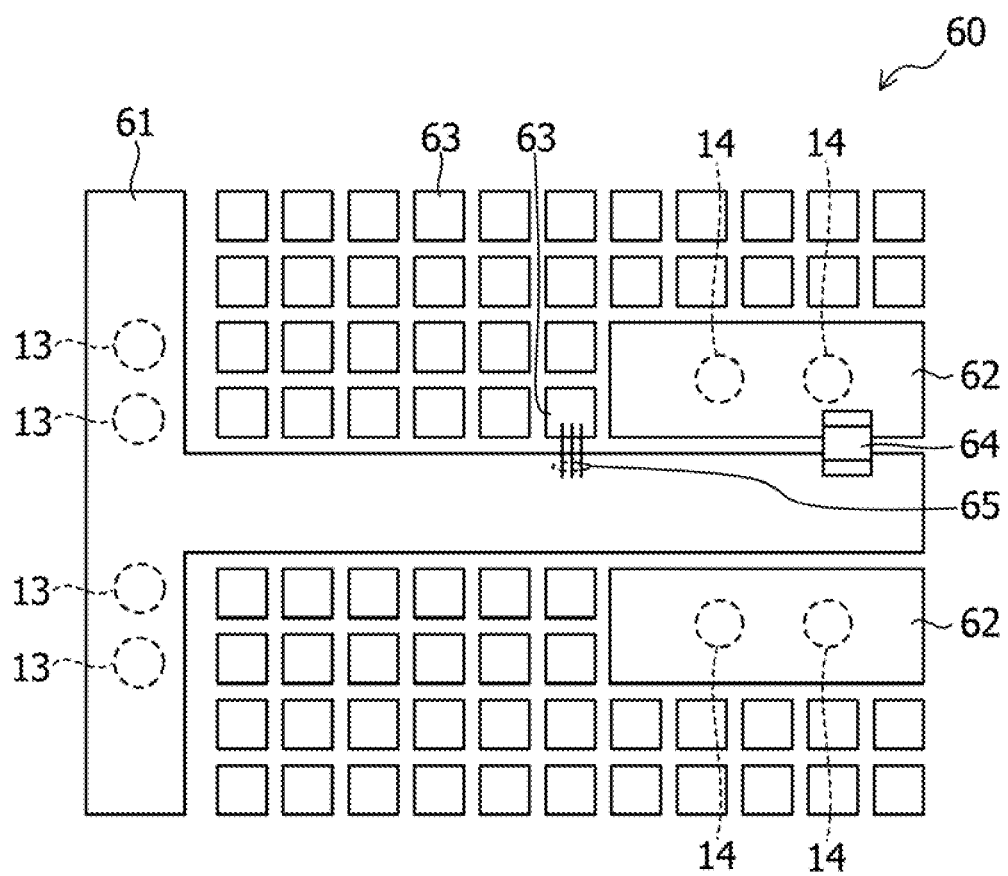
FIG. 9 is a plan view illustrating an example of the pattern of the conductive film constituting a harmonic processing circuit according to the embodiment of the disclosed technology.

FIG. 9 is a plan view illustrating an example of a pattern of a conductive film that constitutes the harmonic processing circuit 60 disposed over the third metal layer M3 according to the embodiment of the disclosed technology.

As described above, the harmonic processing circuit 60 includes the conductive film 61 coupled to the drain electrode 21 through the via 13, and the conductive film 62 coupled to the conductive film 50 disposed over the second metal layer M2 through the via 14. The conductive film 62 is arranged in a vicinity of the conductive film 61 while leaving a gap with the conductive film 61.

The harmonic processing circuit 60 includes a plurality of conductive films 63 arranged in a surrounding of the conductive film 61. Each of the conductive films 63 is not coupled to any one of the first metal layer M1, the second metal layer M2, and the transistor 20 and is set as a floating potential. The conductive film 50 formed over the second metal layer M2 while sandwiching the second dielectric layer D2 is arranged immediately below the conductive film 63. According to this structure, a capacitor is constituted in which the conductive film 63 is set as one electrode, and the conductive film 50 is set as the other electrode.

As illustrated in FIG. 9, the harmonic processing circuit 60 may include a chip capacitor 64 in which one electrode is coupled to the conductive film 61, and the other is electrode is coupled to the conductive film 62.

Figure 10:
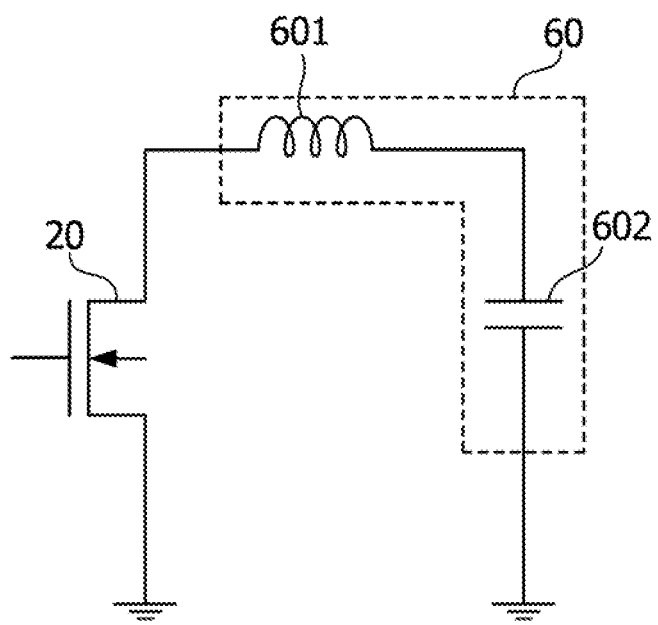
FIG. 10 is an equivalent circuit diagram of the harmonic processing circuit according to the embodiment of the disclosed technology.

FIG. 10 is an equivalent circuit diagram of the harmonic processing circuit 60. The harmonic processing circuit 60 forms an LC series circuit in which an inductor component 601 constituted by including the conductive film 61 and the via 13 and a capacitor component 602 constituted by including the chip capacitor 64 are coupled in series. For example, an inductance of the inductor component 601 may be adjusted by adjusting shapes or dimensions of the conductive film 61. For example, a capacitance of the capacitor component 602 may be adjusted by additionally installing the chip capacitor 64 or the like. As illustrated in FIG. 9, the capacitance of the capacitor component 602 may also be adjusted when the conductive film 63 is coupled to the conductive film 61 by a wire 65. The capacitance of the capacitor component 602 may be increased when the number of conductive films 63 that are coupled to the conductive film 61 among the plurality of conductive films 63 is increased. In the harmonic processing circuit 60, when the inductance of the inductor component 601 and the capacitance of the capacitor component 602 are adjusted, for example, the impedance with respect to the second harmonic of the output signal output from the transistor 20 may be adjusted to approximately zero. Accordingly, the class F operation may be realized in the power amplification apparatus 1.

As described above, in the power amplification apparatus 1 according to the embodiment of the disclosed technology, the multilayer substrate 30 in which the fundamental harmonic matching circuit 40 is formed over the first metal layer M1, and the harmonic processing circuit 60 is formed over the third metal layer M3 is laminated over the transistor 20. The conductive film 41 constituting the fundamental harmonic matching circuit 40 is arranged immediately above the transistor 20 and coupled to the drain electrode 21. The conductive film 61 constituting the harmonic processing circuit 60 is coupled to the drain electrode 21 through the via 13 that penetrates through the first dielectric layer D1 and the second dielectric layer D2 and the first metal layer M1. That is, for example, the fundamental harmonic matching circuit 40 and the harmonic processing circuit 60 are laminated over the transistor 20. When the power amplification apparatus 1 is constituted as described above, the fundamental harmonic matching circuit 40 and the harmonic processing circuit 60 may be arranged in close proximity to the transistor 20. No wire is used for coupling the fundamental harmonic matching circuit 40 and the harmonic processing circuit 60 to the transistor 20. Therefore, since a loss in coupling portions for the fundamental harmonic matching circuit 40 and the harmonic processing circuit 60 and the transistor 20 may be suppressed, the conversion efficiency of the power amplification apparatus 1 may be increased as compared with the related art.

The harmonic processing circuit 60 includes the conductive film 61 coupled to the drain electrode 21 of the transistor 20, and the conductive film 62 coupled to the conductive film 50 disposed over the second metal layer M2. Accordingly, the chip capacitor 64 in which one electrode is coupled to the conductive film 61, and the other electrode is coupled to the conductive film 62 may be included in the harmonic processing circuit 60, and the impedance adjustment of the harmonic processing circuit 60 may be flexibly performed. The harmonic processing circuit 60 includes the plurality of conductive films 63 that are arranged in the vicinity of the conductive film 61 and also set as the floating potential. Accordingly, the impedance adjustment of the harmonic processing circuit 60 may be performed by coupling the conductive films 63 to the conductive film 61 by the wire 65, and flexibility of the impedance adjustment in the harmonic processing circuit 60 may be further increased.

In the aforementioned explanation, the configuration is exemplified where the fundamental harmonic matching circuit and the harmonic processing circuit are both coupled to the drain electrode serving as the output terminal of the transistor, but is not limited to this mode. The fundamental harmonic matching circuit and the harmonic processing circuit may be coupled to the gate electrode serving as the input terminal of the transistor. That is, for example, the power amplification apparatus 1 may include the fundamental harmonic matching circuit and the harmonic processing circuit that perform processing with respect to the input signal input to the transistor 20. Separate fundamental harmonic matching circuits and separate harmonic processing circuits may be coupled to each of the drain electrodes and the gate electrodes. That is, for example, the power amplification apparatus 1 may include the fundamental harmonic matching circuit and the harmonic processing circuit that perform the processing with respect to the input signal input to the transistor 20 and the fundamental harmonic matching circuit and the harmonic processing circuit that perform the processing with respect to the output signal output from the transistor 20.

Figure 11:
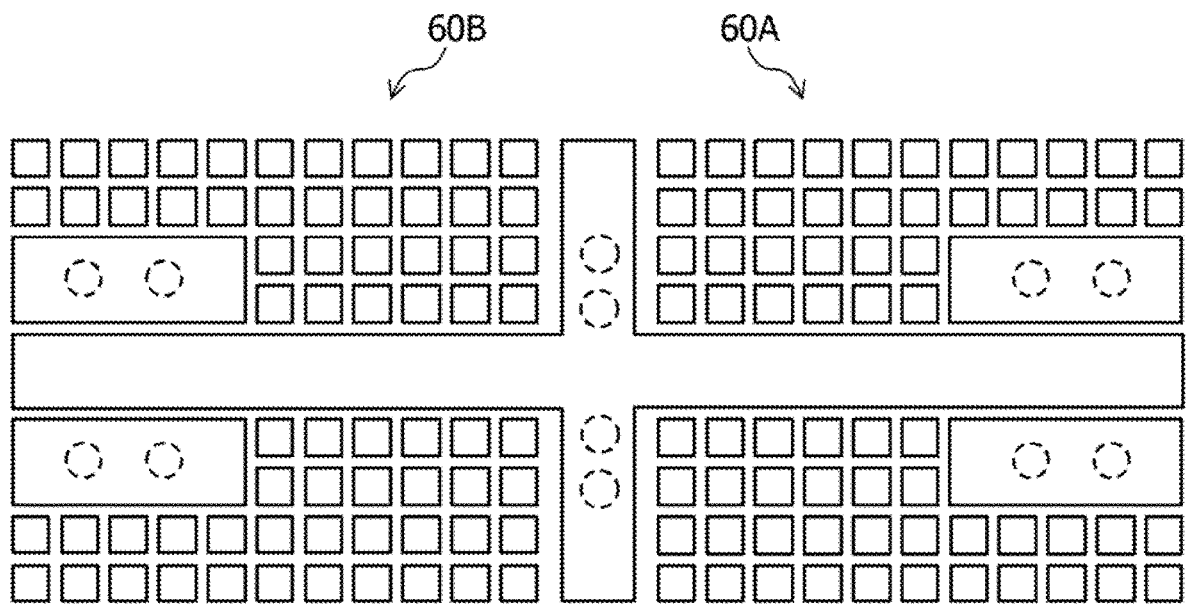
FIG. 11 is a plan view illustrating an example of the pattern of the conductive film constituting the harmonic processing circuit according to the embodiment of the disclosed technology.

In the aforementioned explanation, the case is exemplified where only the harmonic processing circuit 60 that sets the impedance with respect to the second harmonic of the output signal as zero is formed over the third metal layer M3, but is not limited to this mode. For example, as illustrated in FIG. 11, a harmonic processing circuit 60A that sets the impedance with respect to the second harmonic of the output signal as zero and the impedance with respect to the third harmonic of the output signal a harmonic processing circuit 60B that sets as infinite may be disposed over the third metal layer M3.

Figure 12:
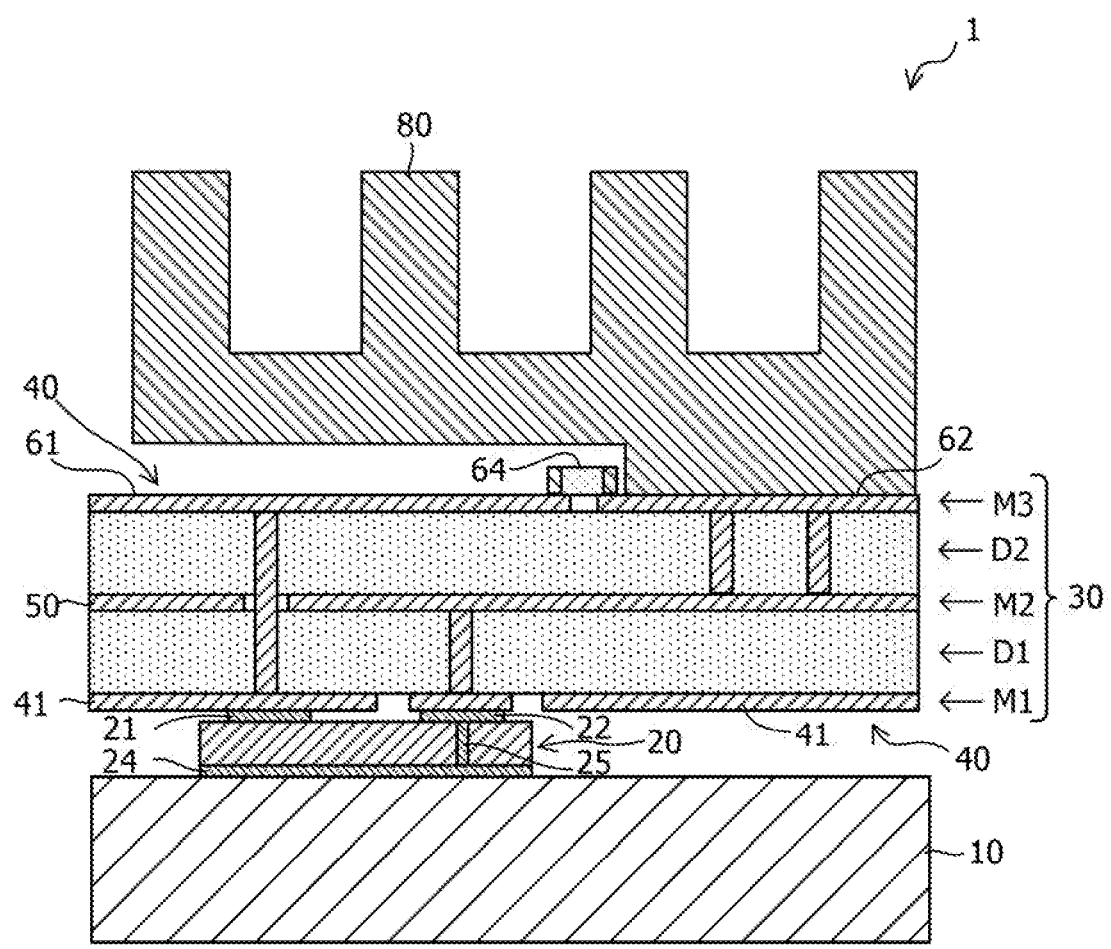
FIG. 12 is a cross sectional view illustrating an example of the configuration of the power amplification apparatus according to the embodiment of the disclosed technology.

As Illustrated in FIG. 12, the power amplification apparatus 1 may include a radiation plate 80 coupled to the conductive film 62 disposed over the third metal layer M3. Accordingly, diffusion of heat emitted from the transistor 20 may be promoted, and temperature increase in the transistor 20 may be suppressed.

Figure 13A:
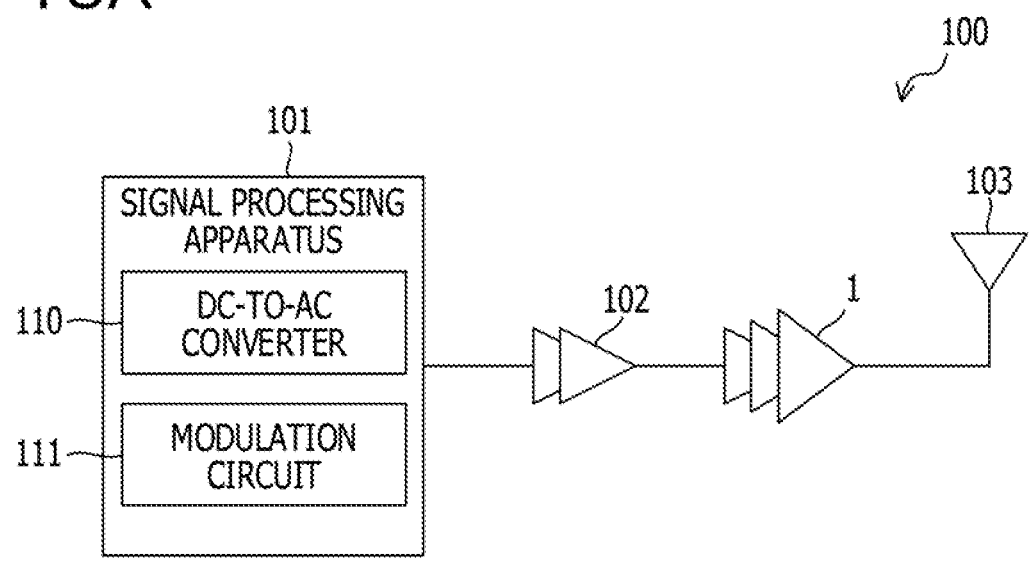
FIG. 13A illustrates an example of a configuration of an electromagnetic radiation apparatus according to the embodiment of the disclosed technology.

FIG. 13A is a drawing illustrating an example of a configuration of an electromagnetic radiation apparatus 100 constituted by including the power amplification apparatus 1 according to the embodiment of the disclosed technology. The electromagnetic radiation apparatus 100 includes a function for performing a communication with an external apparatus by converting a signal into an electromagnetic wave for radiation and is constituted by including the power amplification apparatus 1, a signal processing apparatus 101, a driver amplifier 102, and an antenna 103.

The signal processing apparatus 101 is constituted by including a digital-to-analog converter 110 and a modulation circuit 111. The digital-to-analog converter 110 converts an input digital signal into an analog signal. The modulation circuit 111 applies predetermined modulation process to the analog signal output from the digital-to-analog converter 110. The driver amplifier 102 amplifies a high frequency signal output from the modulation circuit 111 to such a level that in the efficiency becomes a highest in a saturation output value in the power amplification apparatus 1. The power amplification apparatus 1 amplifies power of the signal output from the driver amplifier 102 and outputs the power. The antenna 103 has an input impedance matched to the output impedance of the power amplification apparatus 1. The signal output from the power amplification apparatus 1 is radiated from the antenna 103 as the electromagnetic wave.

Figure 13B:
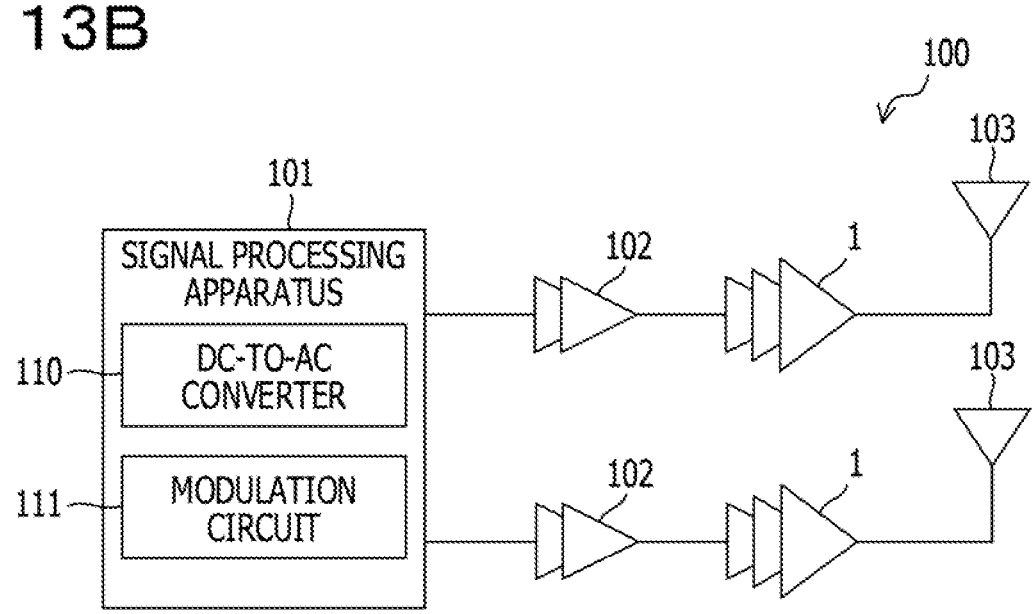
FIG. 13B illustrates an example of the configuration of the electromagnetic radiation apparatus according to the embodiment of the disclosed technology.

FIG. 13B is a drawing illustrating an example of the configuration when the electromagnetic radiation apparatus 100 has two communication channels. In this case, two each of the driver amplifiers 102, the power amplification apparatuses 1, and the antennas 103 are respectively used. The electromagnetic radiation apparatus 100 may have three or more communication channels. When the electromagnetic radiation apparatus 100 has N communication channels, N each of the driver amplifiers 102, the power amplification apparatuses 1, and the antennas 103 are respectively used.

Hereinafter, a fabrication method for the power amplification apparatus according to the embodiment of the disclosed technology is described with reference to FIGS. 14A to 14Q. In the following explanation, a case is exemplified where the power amplification apparatus is fabricated using the FOWLP technology. In the following explanation, a case is exemplified where the fundamental harmonic matching circuit of the output side and the harmonic processing circuit of the output side are coupled to the drain electrode of the transistor, and the fundamental harmonic matching circuit of the input side and the harmonic processing circuit of the input side are coupled to the gate electrode of the transistor.

Figure 14A:
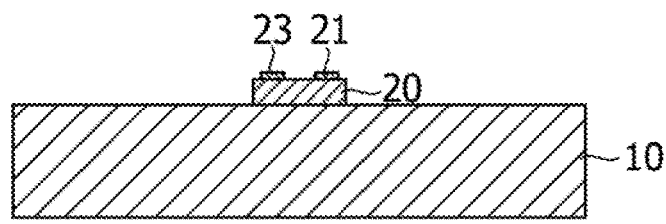
FIG. 14A illustrates an example of a fabrication method for the power amplification apparatus according to the embodiment of the disclosed technology.

First, the transistor 20 is bonded to the front surface of the base member 10 using the conductive bonding member (not illustrated) such as AuSn and Ag paste (FIG. 14A).

Figure 14B:
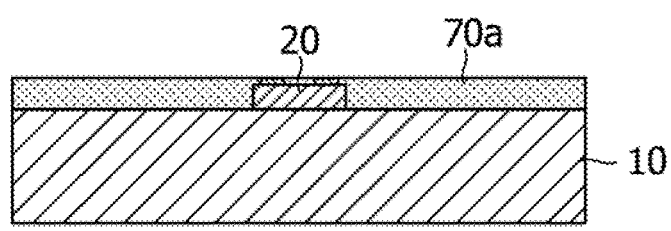
FIG. 14B illustrates an example of the fabrication method for the power amplification apparatus according to the embodiment of the disclosed technology.
Figure 14C:
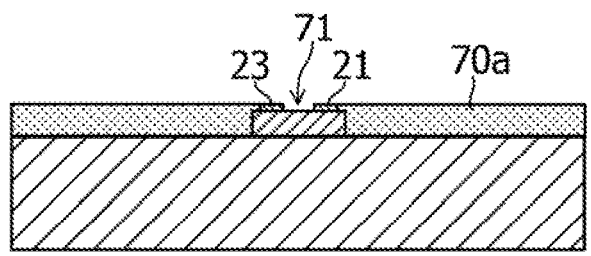
FIG. 14C illustrates an example of the fabrication method for the power amplification apparatus according to the embodiment of the disclosed technology.
Figure 14D:
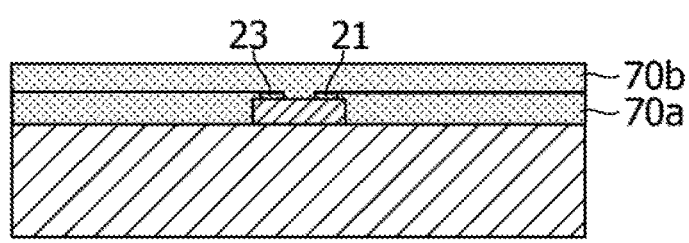
FIG. 14D illustrates an example of the fabrication method for the power amplification apparatus according to the embodiment of the disclosed technology.
Figure 14E:
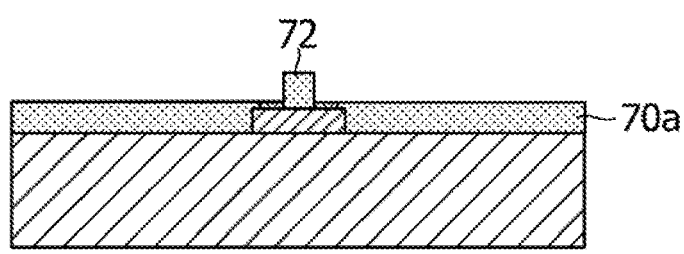
FIG. 14E illustrates an example of the fabrication method for the power amplification apparatus according to the embodiment of the disclosed technology.

Next, a resist 70a having photosensitivity is formed over the front surface of the base member 10. The transistor 20 is buried inside the resist 70a (FIG. 14B). Next, patterning of the resist 70a is performed using a photolithography technology. Accordingly, an opening portion 71 is formed between the drain electrode 21 and the gate electrode 23 (FIG. 14C). Next, a resist 70b having photosensitivity is formed over a front surface of the resist 70a (FIG. 14D). Next, patterning of the resist 70b is performed using the photolithography technology. Accordingly, the front surfaces of the resist 70a, the drain electrode 21, and the gate electrode 23 are exposed, and a mask 72 constituted by a remaining part of the resist 70b is formed between the drain electrode 21 and the gate electrode 23 (FIG. 14E).

Figure 14F:
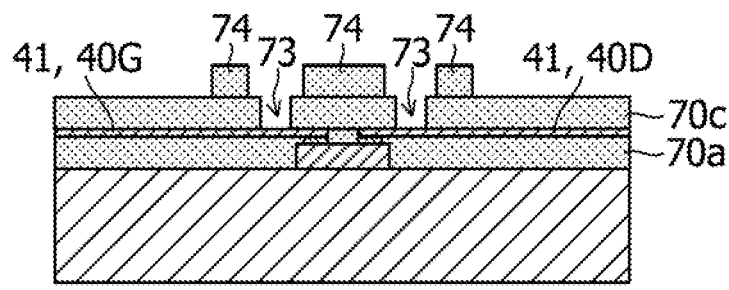
FIG. 14F illustrates an example of the fabrication method for the power amplification apparatus according to the embodiment of the disclosed technology.
Figure 14G:
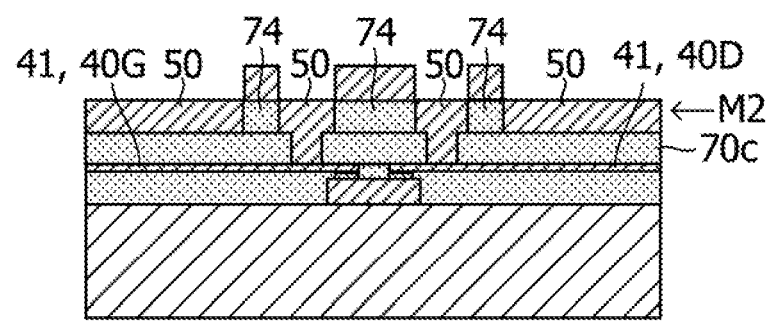
FIG. 14G illustrates an example of the fabrication method for the power amplification apparatus according to the embodiment of the disclosed technology.

Next, the conductive film 41 that covers an upper part of the transistor 20 is formed using a spatter method or an evaporation method. A layer where the conductive film 41 is formed serves as the first metal layer M1 (FIG. 14F). Next, patterning of the conductive film 41 is performed using the photolithography technology and an etching technology. A part of the conductive film 41 which is formed over the mask 72 is removed together with the mask 72. A fundamental harmonic matching circuit 40G of the input side coupled to the gate electrode 23 and a fundamental harmonic matching circuit 40D of the output side coupled to the drain electrode 21 are formed in the first metal layer M1 by the patterning of the conductive film 41 (FIG. 14G).

Figure 14H:
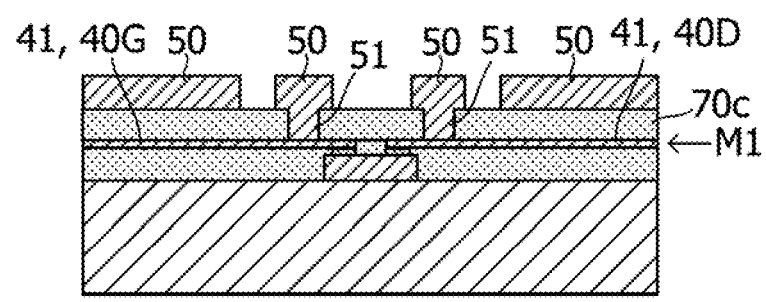
FIG. 14H illustrates an example of the fabrication method for the power amplification apparatus according to the embodiment of the disclosed technology.
Figure 14I:
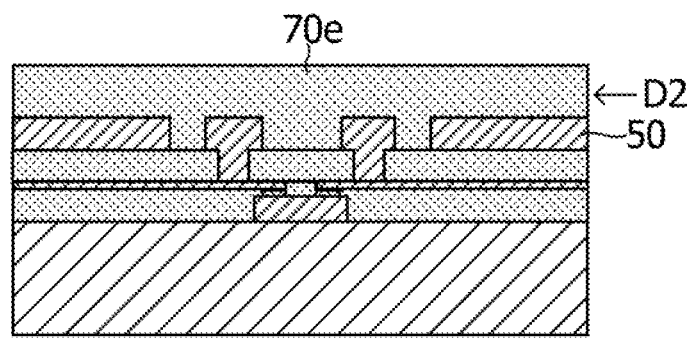
FIG. 14I illustrates an example of the fabrication method for the power amplification apparatus according to the embodiment of the disclosed technology.
Figure 14J:
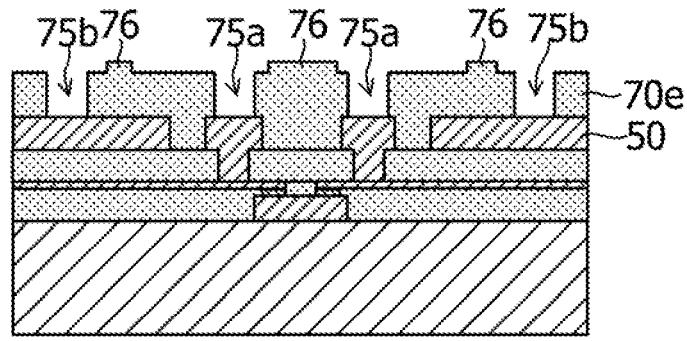
FIG. 14J illustrates an example of the fabrication method for the power amplification apparatus according to the embodiment of the disclosed technology.
Figure 14K:
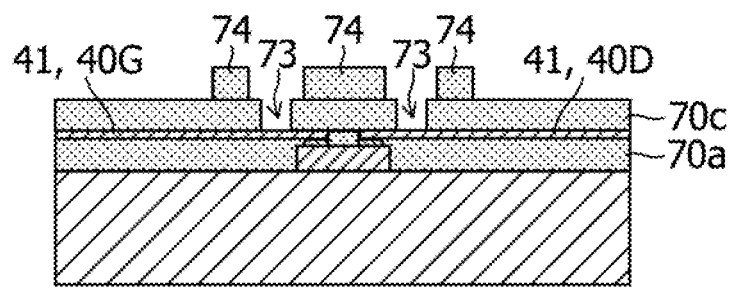
FIG. 14K illustrates an example of the fabrication method for the power amplification apparatus according to the embodiment of the disclosed technology.

Next, a resist 70c having photosensitivity is formed over the front surface of the conductive film 41. A layer where the resist 70c is formed serves as the first dielectric layer D1 (FIG. 14H). Next, patterning of the resist 70c is performed using the photolithography technology. Accordingly, an opening portion 73 that respectively partially exposes a part of the conductive film 41 which constitutes the fundamental harmonic matching circuit 40G of the input side and a part of the conductive film 41 which constitutes the fundamental harmonic matching circuit 40D of the output side (FIG. 14I). Next, a resist 70d having photosensitivity is formed over a front surface of the resist 70c. The opening portion 73 of the resist 70c is filled with the resist 70d (FIG. 14)). Next, patterning of the resist 70d is performed using the photolithography technology. Accordingly, a part filled in the opening portion 73 of the resist 70d is removed, and also a mask 74 constituted by a remaining part of the resist 70d is formed over the front surface of the resist 70c (FIG. 14K).

Figure 14L:
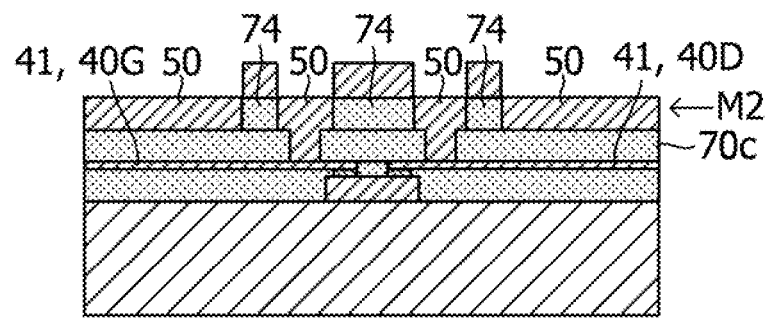
FIG. 14L illustrates an example of the fabrication method for the power amplification apparatus according to the embodiment of the disclosed technology.
Figure 14M:
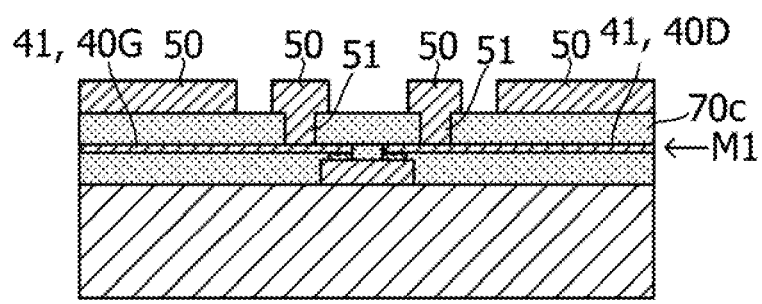
FIG. 14M illustrates an example of the fabrication method for the power amplification apparatus according to the embodiment of the disclosed technology.

Next, the conductive film 50 is formed over the front surface of the resist 70c using the spatter method or the evaporation method. A layer where the conductive film 50 is formed serves as the second metal layer M2 (FIG. 14L). A part of the conductive film 50 which is formed over the mask 74 is removed together with the mask 74. Accordingly, patterning of the conductive film 50 is performed. A part of the conductive film 50 which is coupled to the source electrode (not illustrated) of the transistor 20 through the via (not illustrated) functions as the ground plane. A via 51 is formed in a part of the conductive film 50 which is filled in the opening portion 73 (see FIG. 14K) of the resist 70c. The via 51 is coupled to the conductive film 41 disposed over the first metal layer M1.

Figure 14N:
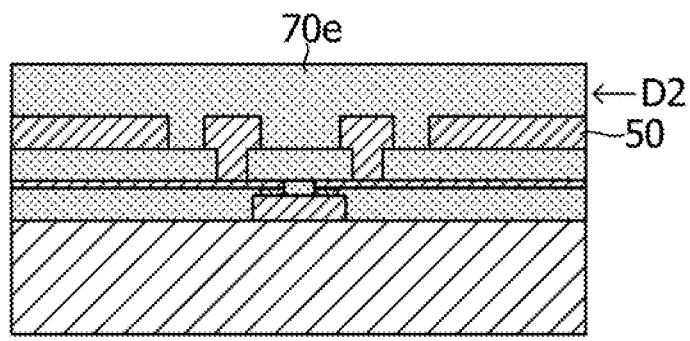
FIG. 14N illustrates an example of the fabrication method for the power amplification apparatus according to the embodiment of the disclosed technology.
Figure 14O:
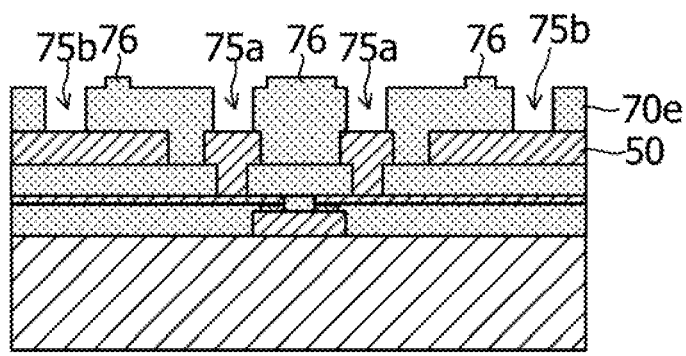
FIG. 14O illustrates an example of the fabrication method for the power amplification apparatus according to the embodiment of the disclosed technology.

Next, a resist 70e is formed over a front surface of the conductive film 50. A layer where the resist 70e is formed serves as the second dielectric layer D2 (FIG. 14N). Next, patterning of the resist 70e is performed using the photolithography technology. Accordingly, opening portions 75a and 75b that partially expose the conductive film 50 are formed. A mask 76 having a predetermined pattern is formed (FIG. 14O).

Figure 14P:
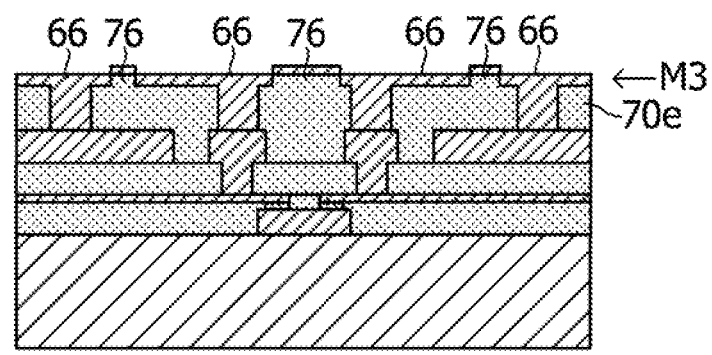
FIG. 14P illustrates an example of the fabrication method for the power amplification apparatus according to the embodiment of the disclosed technology.

Next, a conductive film 66 is formed over a front surface of the resist 70e using the spatter method or the evaporation method. A layer where the conductive film 66 is formed serves as the third metal layer M3 (FIG. 14P).

Figure 14Q:
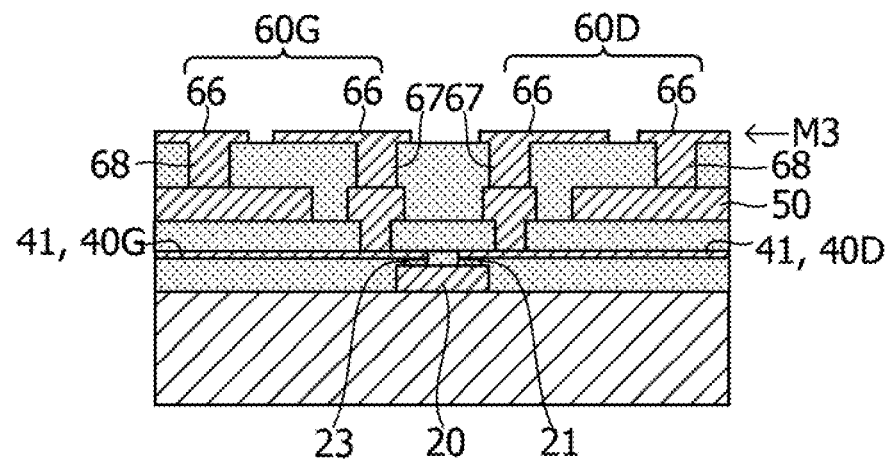
FIG. 14Q illustrates an example of the fabrication method for the power amplification apparatus according to the embodiment of the disclosed technology.

Next, a part of the conductive film 66 which is formed over the mask 76 is removed together with the mask 76 (FIG. 14Q). Accordingly, patterning of the conductive film 66 is performed, and the harmonic processing circuit 60G of the input side and the harmonic processing circuit 60D of the output side are formed in the third metal layer M3. A via 67 is formed in a part of the conductive film 66 which is filled in the opening portion 75a of the resist 70e (see FIG. 14O), and a via 68 is formed in a part of the conductive film 66 which is filled in the opening portion 75b of the resist 70e (see FIG. 14O). The harmonic processing circuit 60G of the input side includes a part coupled to the gate electrode 23 through the via 67, the conductive film 50, and the conductive film 41 and a part coupled to the part functioning as the ground plane of the conductive film 50 through the via 68. Similarly, the harmonic processing circuit 60D of the output side includes a part coupled to the drain electrode 21 through the via 67, the conductive film 50, and the conductive film 41 and a part coupled to the part functioning as the ground plane of the conductive film 50 through the via 68.

When the aforementioned respective processes are performed, the power amplification apparatus is completed. In accordance with the aforementioned fabrication method for the power amplification apparatus according to the embodiment of the disclosed technology, the fundamental harmonic matching circuits 40G and 40D and the harmonic processing circuits 60G and 60D may be arranged in close proximity to the transistor 20. No wire is used for coupling the fundamental harmonic matching circuits 40G and 40D and the harmonic processing circuits 60G and 60D to the transistor 20. Therefore, since the loss in the coupling portions for the fundamental harmonic matching circuits 40G and 40D and the harmonic processing circuits 60G and 60D and the transistor 20 may be suppressed, the conversion efficiency of the power amplification apparatus may be increased as compared with the related art.

The power amplification apparatus 1 is an example of the power amplification apparatus according to the disclosed technology. The transistor 20 is an example of the transistor according to the disclosed technology. The gate electrode 23 is an example of the input terminal according to the disclosed technology. The drain electrode 21 is an example of the output terminal according to the disclosed technology. The gate electrode 23 is an example of the input terminal according to the disclosed technology. The fundamental harmonic matching circuits 40, 40D, and 40G are examples of the fundamental harmonic matching circuit according to the disclosed technology. The conductive film 41 is an example of the first conductive film according to the disclosed technology. The harmonic processing circuits 60, 60A, 60B, 60D, and 60G are examples of the harmonic processing circuit according to the disclosed technology. The conductive film 61 is an example of the second conductive film according to the disclosed technology. The first dielectric layer D1 is an example of the first dielectric layer according to the disclosed technology. The second dielectric layer D2 is an example of the second dielectric layer according to the disclosed technology. The conductive film 50 is an example of the third conductive film according to the disclosed technology. The conductive film 62 is an example of the fourth conductive film according to the disclosed technology. The conductive film 63 is an example of the fifth conductive film according to the disclosed technology. The chip capacitor 64 is an example of the capacitor according to the disclosed technology. The electromagnetic radiation apparatus 100 is an example of the electromagnetic radiation apparatus according to the disclosed technology.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A power amplification apparatus comprising:
   a transistor including an input terminal to which an input signal is input and an output terminal from which an output signal is output;
   a fundamental harmonic matching circuit configured to include a first conductive film and match a load impedance with respect to a fundamental harmonic of at least any one of the input signal or the output signal to an impedance of the transistor, the first conductive film being laminated over the transistor and coupled to at least one of the input terminal and the output terminal;
   a harmonic processing circuit configured to include a second conductive film or adjust an impedance with respect to a harmonic of at least any one of the input signal and the output signal, the second conductive film being laminated over the first conductive film and coupled to at least any one of the input terminal or the output terminal through a via which penetrates through a dielectric layer, the dielectric layer being sandwiched between the first conductive film and the second conductive film;
   a first dielectric layer laminated over the first conductive film;
   a third conductive film laminated over the first dielectric layer and applied with a predetermined potential; and
   a second dielectric layer disposed between the third conductive film and the second conductive film,
   the harmonic processing circuit includes:

a fourth conductive film laminated over the second dielectric layer and coupled to the third conductive film through a via that penetrates through the second dielectric layer; and a capacitor in which one electrode is coupled to the second conductive film, and the other electrode is coupled to the fourth conductive film.

2. The power amplification apparatus according to claim 1, wherein the harmonic processing circuit includes a fifth conductive film laminated over the second dielectric layer and set as a floating potential.

3. The power amplification apparatus according to claim 1, wherein the harmonic processing circuit is configured to set an impedance with respect to a second harmonic of at least one of the input signal and the output signal as zero.

4. An electromagnetic radiation apparatus comprising:

a signal processing apparatus configured to perform predetermined processing with respect to a supplied signal;

a power amplification apparatus configured to receive, as an input signal, the supplied signal processed by the signal processing apparatus and amplify power of the input signal to be output as an output signal; and an antenna configured to radiate an electromagnetic wave by using the output signal output from the power amplification apparatus, the power amplification apparatus including a transistor including an input terminal to which an input signal is input and an output terminal from which an output signal is output, a fundamental harmonic matching circuit configured to include a first conductive film and match a load impedance with respect to a fundamental harmonic of at least any one of the input signal or the output signal to an impedance of the transistor, the first conductive film being laminated over the transistor and coupled to at least any one of the input terminal or the output terminal, and a harmonic processing circuit configured to include a second conductive film and adjust an impedance with respect to a harmonic of at least any one of the input signal or the output signal, the second conductive film being laminated over the first conductive film and coupled to at least any one of the input terminal or the output terminal through a via which penetrates through a dielectric layer, the dielectric layer being sandwiched between the first conductive film and the second conductive film;

a first dielectric layer laminated over the first conductive film;

a third conductive film laminated over the first dielectric layer and applied with a predetermined potential; and a second dielectric layer disposed between the third conductive film and the second conductive film, the harmonic processing circuit includes:

a fourth conductive film laminated over the second dielectric layer and coupled to the third conductive film through a via that penetrates through the second dielectric layer; and a capacitor in which one electrode is coupled to the second conductive film, and the other electrode is coupled to the fourth conductive film.

* * * * *